(12) United States Patent
Colgan et al.

(10) Patent No.: US 9,093,445 B2
(45) Date of Patent: Jul. 28, 2015

(54) PACKAGING IDENTICAL CHIPS IN A STACKED STRUCTURE

(75) Inventors: Evan G. Colgan, Chestnut Ridge, NY (US); Luke D. LaCroix, Williston, VT (US); Mark C. H. Lamorey, South Burlington, VT (US); David B. Stone, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 106 days.

(21) Appl. No.: 13/219,084

(22) Filed: Aug. 26, 2011

(65) Prior Publication Data

US 2013/0049834 A1 Feb. 28, 2013

(51) Int. Cl.
*H03K 3/00* (2006.01)
*H01L 23/50* (2006.01)
*H01L 25/065* (2006.01)
*G11C 11/4072* (2006.01)

(52) U.S. Cl.
CPC ............ *H01L 23/50* (2013.01); *H01L 25/0657* (2013.01); *G11C 11/4072* (2013.01); *H01L 2225/06527* (2013.01); *H01L 2225/06555* (2013.01); *H01L 2225/06562* (2013.01); *H01L 2924/0002* (2013.01); *H03K 3/00* (2013.01)

(58) Field of Classification Search
CPC ............ H01L 2924/00; H01L 25/0657; H01L 2224/16125; H03K 3/00
USPC .................................. 257/723, 726, 685–686
See application file for complete search history.

(56) References Cited

U.S. PATENT DOCUMENTS

| | | | | |
|---|---|---|---|---|
| 4,791,552 | A * | 12/1988 | Natusch et al. | 711/200 |
| 5,490,041 | A | 2/1996 | Furukawa et al. | |
| 7,098,541 | B2 * | 8/2006 | Adelmann | 257/777 |
| 7,398,441 | B1 * | 7/2008 | Gee | 714/727 |
| 7,494,846 | B2 | 2/2009 | Hsu et al. | |
| 7,598,523 | B2 | 10/2009 | Luo et al. | |
| 7,732,328 | B2 | 6/2010 | Kwon et al. | |
| 7,791,175 | B2 | 9/2010 | Pyeon | |
| 7,838,967 | B2 * | 11/2010 | Chen | 257/621 |
| 8,071,989 | B2 * | 12/2011 | Chao | 257/89 |
| 8,243,485 | B2 * | 8/2012 | Jin et al. | 365/51 |
| 2006/0063304 | A1 * | 3/2006 | Lamson et al. | 438/106 |
| 2007/0198770 | A1 * | 8/2007 | Horii et al. | 711/103 |
| 2009/0273098 | A1 | 11/2009 | Bartley et al. | |

(Continued)

FOREIGN PATENT DOCUMENTS

GB 2402547 A 12/2004

*Primary Examiner* — Marc Armand
*Assistant Examiner* — Quinton Brasfield
(74) *Attorney, Agent, or Firm* — Anthony Canale; Roberts Mlotkowski Safran & Cole, P.C.

(57) ABSTRACT

Methods and structures are provided for packaging identically processed chips in a stacked structure. A latch chain includes a first latch chain, having a single or multiple latches, associated with a first chip. The first latch chain is structured to read data information from the first chip. The latch chain includes a second latch chain, having a single or multiple latches, associated with a second chip. The second latch chain is structured to read data information from the second chip. The first latch chain and the second latch chain are connected to one another such that form a single latch chain that crosses chip boundaries. The first latch chain and the second latch chain are structured to provide identification information for identifying the first chip and the second chip, respectively.

20 Claims, 4 Drawing Sheets

(56) References Cited

U.S. PATENT DOCUMENTS

| | | |
|---|---|---|
| 2010/0105169 A1 | 4/2010 | Lee et al. |
| 2010/0195401 A1* | 8/2010 | Jeong et al. ............... 365/185.19 |
| 2010/0289064 A1 | 11/2010 | Or-Bach et al. |
| 2010/0291749 A1 | 11/2010 | Or-Bach et al. |
| 2010/0295136 A1 | 11/2010 | Or-Bach et al. |
| 2011/0055297 A1* | 3/2011 | Maeda et al. ................. 707/824 |
| 2011/0102066 A1* | 5/2011 | Jin et al. ........................ 327/524 |
| 2011/0103121 A1* | 5/2011 | Osakabe ......................... 365/51 |
| 2012/0057411 A1* | 3/2012 | Koeppe et al. ........... 365/189.02 |
| 2012/0105093 A1* | 5/2012 | Lee .......................... 324/762.01 |

\* cited by examiner

PACKAGING IDENTICAL CHIPS IN A STACKED STRUCTURE

FIELD OF THE INVENTION

The invention relates to semiconductor structures and, more particularly, to methods and structures for packaging identically processed chips in a stacked structure.

BACKGROUND

Constant improvements in the integration density of various electronic components (e.g., transistors, diodes, resistors, capacitors, etc.) have resulted from repeated reductions in minimum feature size. This, in turn, has allowed more components to be integrated into a given chip area. Although improvements in lithography techniques has resulted in considerable size reductions, physical limitations to the density remains a barrier to further improvements. For example, as the component size is reduced and more devices are placed on a single chip, design complexities arise, including, for example, a significant increase in the number and length of interconnections between devices. Also, it is known that an increase in the number and length of interconnections results in both circuit RC delay and power consumption increase.

To solves these issues, stacked dies (chips) are commonly used to increase chip density. In the stacked chip configuration, it is preferred that processed chips have exactly the same design, and be fabricated using a same set of masks in order to increase fabrication efficiency and reduce manufacturing and mask costs. However, since each chip needs to have a set of unique addresses, it becomes difficult to distinguish different chips from each other. For this reason, for example, it has now been recognized that identical memory chips cannot be simply stacked one on top of the other. Instead, a considerable amount of customization is required, which increases fabrication costs. Illustratively, customization requires different mask sets, which results in significant additional costs to the fabrication process.

Accordingly, there exists a need in the art to overcome the deficiencies and limitations described hereinabove.

SUMMARY

In an aspect of the invention, a latch chain comprises a first latch chain, comprised of a single or multiple latches, associated with a first chip. The first latch chain is structured to read data information from the first chip. The latch chain further comprises a second latch chain, comprised of a single or multiple latches, associated with a second chip. The second latch chain is structured to read data information from the second chip. The first latch chain and the second latch chain are connected to one another such that they form a single latch chain that crosses chip boundaries. The first latch chain and the second latch chain are structured to provide identification information for identifying the first chip and the second chip, respectively.

In an aspect of the invention, a structure comprises a plurality of chips provided in a stacked configuration and each having connections which, when the plurality of chips are stacked, are oriented to permit non-shared, individual signal connections with a solder bump or other type of electrical connection.

In an aspect of the invention, a method comprises independent addressing of identical integrated circuits in a through-silicon-via chip stack, which occurs after chip stacking.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the chip connections, which comprises the structures of the present invention. In still further embodiments, a method in a computer-aided design system is provided for generating a functional design model of the chip connections. The method comprises generating a functional representation of the structural elements of the chip connections.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to methods and structures for packaging identically processed chips in a stacked structure. More specifically, the present invention includes methods and structures for differentiating and controlling individual identical chips in a stacked structure. For example, in embodiments, the present invention includes a post stacked latch chain structure that assembles through through-silicon-vias (TSV). The post stacked latch chain structure allows for post stack address programming (per chip) and additional addressing options. In another approach, patterns for solder bump connections (e.g., C4 connections) or other types of electrical connections between chips such as copper to copper bonds, or intermetallic bonds, are provided in a specific sequence which allows for a four high chip stack by rotating and/or flipping each overlaying chip. Hybrid versions of the rotation technique along with positional self identification is also contemplated by the present invention.

Advantageously, the present invention provides structures that allow for 100% identically processed chips (e.g., memory, processor, ASICS, Test Vehicles, etc.) to be stacked and differentiated. Customization costs can now be avoided, considerably reducing fabrication and design costs. For example, by implementing the methods and structures of the present invention, additional customized masks are no longer required in the processing, thus considerably reducing mask and manufacturing costs.

Figure 1:
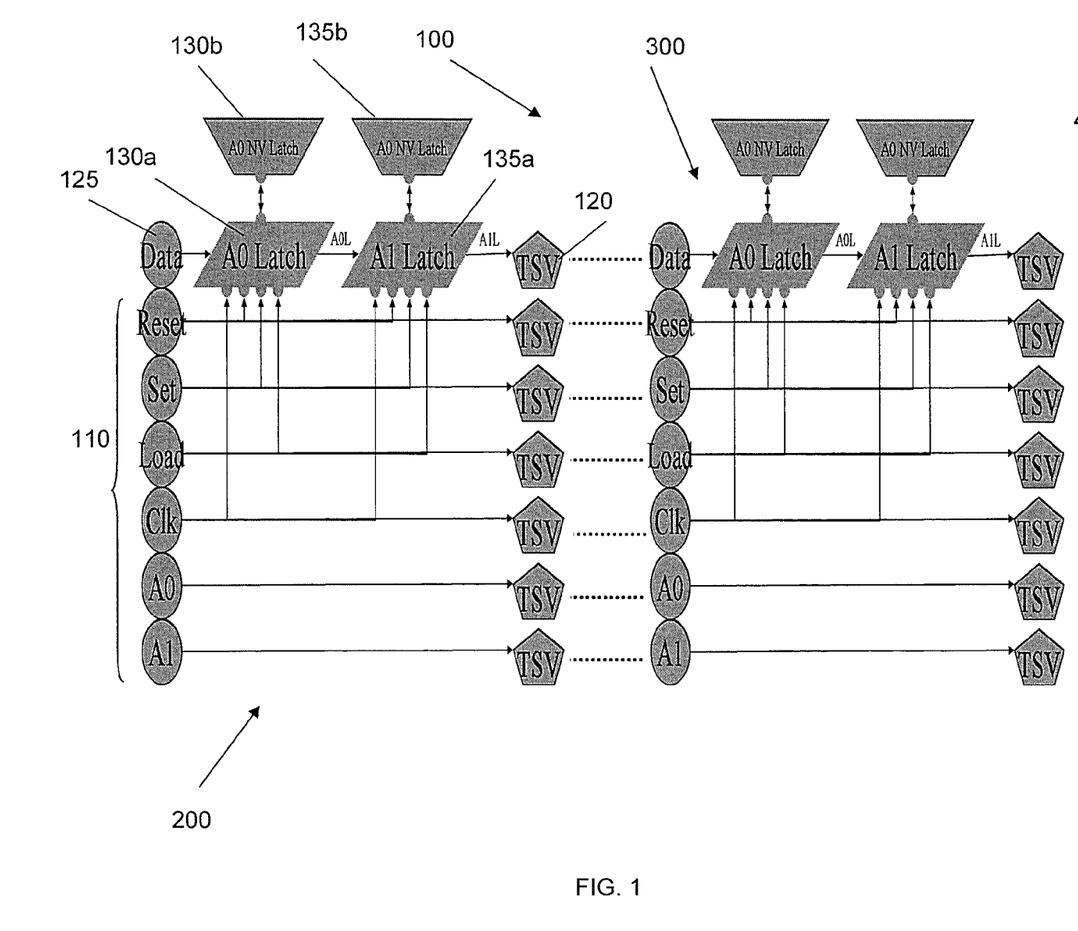
FIG. 1 shows a latch structure for a post stack address assignment methodology in accordance with aspects of the present invention.

FIG. 1 shows a latch structure in accordance with aspects of the present invention. More specifically, FIG. 1 shows a post stacked latch chain structure 100 that assembles through through-silicon-vias (TSV), and which is structured and arranged to allow independent addressing of identical integrated circuit (IC) chips in a TSV chip stack. Advantageously, in this configuration, the independent addressing of each chip occurs after chip stacking using the latch chain structure, in combination with a command enable circuit.

More specifically, the stacked latch chain structure 100 includes a plurality of identically processed chips 200, 300, etc., provided in a stacked configuration, each having a plurality of latches 130a, 135a, e.g., two or more latches, that read information from shared data pins 110, e.g., clock pin, load pin, set pin and reset pin. In the embodiment shown in FIG. 1, the latches include an A0 latch (flip/flop) 130a and an A1 latch (flip/flop) 135a. The shared pins 110 are connected together through through-silicon-vias (TSV) 120.

In embodiments, the pins 110 can be any type of data pin which provides discrete address information, control and/or functionality to the chips in the stack. For example, the pins 110 can include a clock pin, load pin, set pin and reset pin. The stacked chips 200, 300 also include control pins, i.e., A0 pin and A1 pin. In embodiments, the plurality of latches 130a, 135a, e.g., two or more latches, read information from the data pins 110, e.g., clock pin, load pin, set pin and reset pin. For example, the clock pin provides a clock value, and triggers the load pin and the set pin. The load pin loads the information into the latches 130a, 135a; whereas, the set pin sets the data information into the latches 130a, 135a. The reset pin can reset the values in the latches 130a, 135a.

The latches 130a, 135a are also connected to data pins 125, which permit data to be serially loaded into the latches 130a, 135a across all the chips 200, 300 . . . n, in the stack. In this way, the latches 130a, 135a form a latch chain that crosses chip boundaries capable of identifying each chip in the stack by using address information obtained from the pins 110, themselves. This allows the structure and method of the present invention to identify each chip, post assembly, and hence discretely control each chip.

In embodiments, the latches 130a, 135a provide pin data (e.g., address information) to storage structures 130b, 135b, respectively. In embodiments, the storage structures 130b, 135b are non-volatile memory or fuses, structured to store each clock value of each pin connection for each chip. For example, the storage structures 130b, 135b can store address information for each pin for each chip. In this way, upon power up, it is possible to read values stored in the storage structures 130b, 135b, for discrete identification and control of the individual chips in a stack.

Figure 2:
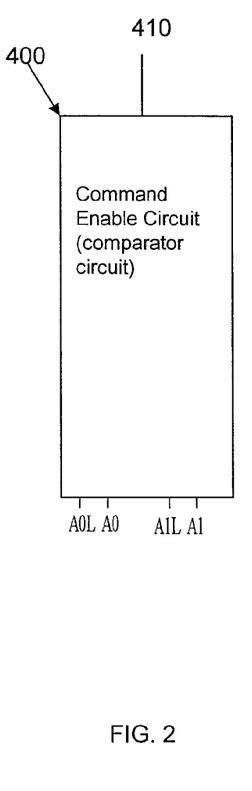
FIG. 2 shows a chip enable circuit in accordance with aspects of the present invention.

FIG. 2 shows a command enable circuit in accordance with aspects of the present invention. The command enable circuit (comparator circuit) 400 is provided on each chip of the plurality of chips. The command enable circuit 400 has connections to the latches 130a, 135a and the A0 pin and A1 pin for each chip of the post stacked latch chain structure. The command enable circuit 400 also includes an output signal 410 that provides a control signal to an identified chip based on a comparison of data received from each control pins A0, A1 and the pin data stored in the storage structures, e.g., address information for each pin. More specifically, by using the command enable circuit 400, it is possible to compare the data values stored in the storage structure 130b, 135b of each latch 130a, 135a to data received from the A0 and A1 pins. In turn, this comparison allows the command enable circuit 400 to identify one or more chips, and provide a discrete control signal that goes through each chip so that data can be loaded into any combination of the identified chips in the stacked structure.

More specifically, in operation, the post stacked latch chain structure 100 allows serially loading of data into the latches 130a, 135a across all the chips 200, 300 in the stack. The latch storage structures 130b, 135b, e.g., non-volatile memory, can be hard set with the pin data. This pin data can then be compared against two address bits (A0, A1) that make up a chip enable signal. If there is a match with the two address bits (A0, A1), the command enable circuit 400 will provide a control signal to the identified chip in the stack.

It is also possible to reset the latches 130a, 135a, any time, in order to place all the chips into a global command mode (same commands to all chips), or to reload the storage structures 130b, 135b at any time to put the chips into a specific addressable mode. Additionally, normal operation would have the storage structure 130b, 135b set to sequential addresses, and the user to occasionally reset the latches 130a, 135a to address all chips together and/or soft load the latches 130a, 135a to address two or more chips at a time. This scheme works with stacks of any number of chips with no limit (e.g., limit would be the depth of latches and addresses in the silicon design).

FIGS. 3-6 show various structures, i.e., grid patterns of connections (e.g., TSV to solder or other electrical connections), on each of a plurality of integrated circuit (IC) chips. In embodiments, the grid patterns are structured and arranged such that when an immediately overlaying chip is oriented differently, e.g., rotated by 90 degrees and/or flipped, and stacked upon an immediately underlying chip, none of the utilized connections for a given chip is shared with any of the other chips. For example, a signal connection that is coupled to chip #2 would not be coupled to chips #1, #3, and #4, even though the chips are identical chips (e.g., memory, processor, etc.).

Figure 3:
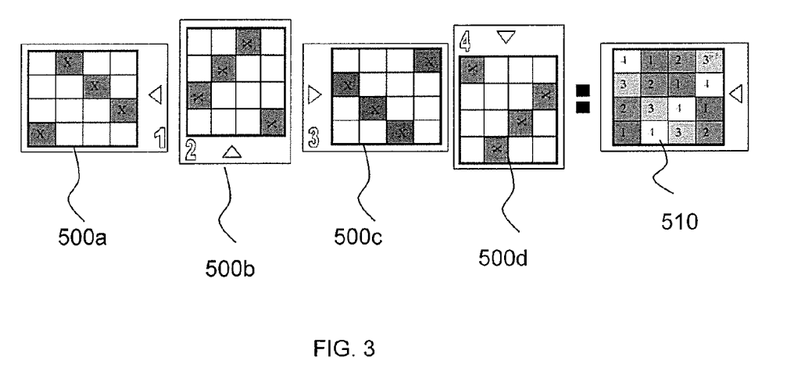
FIG. 3 shows a plurality of chips each having a same grid pattern of connections in accordance with aspects of the present invention.

More specifically, FIG. 3 shows a plurality of chips, i.e., 4 chips, each having a same grid pattern of connections. The plurality of chips 500a, 500b, 500c and 500d include a grid pattern comprising 16 discrete areas, where the areas designated with an "X" are independent chip connections for each of the plurality of chips 500a, 500b, 500c and 500d; whereas, the blank areas are pass through through-silicon-vias (TSV) to solder or other electrical connections. In embodiments, the chip connections "X" are located at the following discrete areas of the grid pattern, with respect to chip 500a:

(i) A connection in the lower left corner;
(ii) A connection at the juncture of the top row, second column;
(iii) A connection at the juncture of the second row, third column; and
(iv) A connection at the juncture of the third row, fourth column.

In the grid pattern configuration of FIG. 3, each of the chips in the stack can be rotated by 90 degrees (with respect to an overlying and underlying chip) and overlayed to form a stacked structure 510. In the stacked structure 510, none of the chip connections of the four chips 500a, 500b, 500c and 500d are shared amongst each other. This is shown by reference numerals 1, 2, 3, and 4, which are representative of the connections "X" for each of the four chips 500a, 500b, 500c and 500d. In this way, the blank areas for each chip are pass through through-silicon-vias (TSV) to solder connections, thus allowing a connection for another chip in such discrete areas. Accordingly, each chip can be discretely controlled by its individual, non-shared pin connections.

Figure 4:
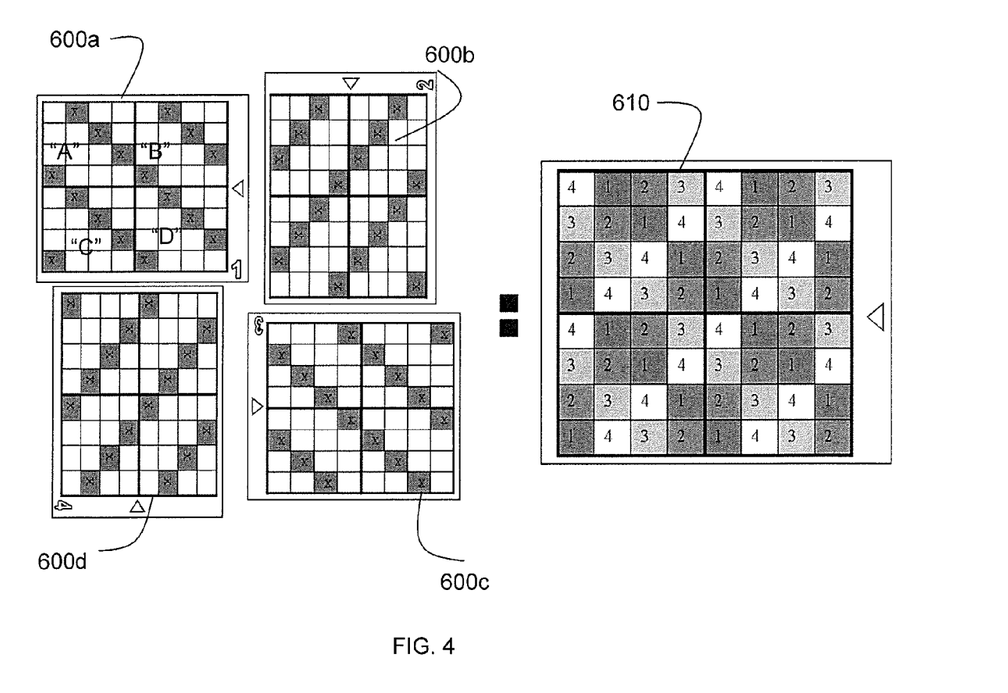
FIG. 4 shows a plurality of chips each having a same grid pattern of connections in accordance with another aspect of the present invention.

FIG. 4 shows a plurality of chips, e.g., 4 chips, each having a same grid pattern of connections. The plurality of chips 600a, 600b, 600c and 600d include a grid pattern comprising four quadrants "A", "B", "C" and "D", each having 16 discrete areas. The areas designated with an "X" are independent chip connections for each of the plurality of chips 600a, 600b, 600c and 600d; whereas, the blank areas are pass through through-silicon-vias (TSV) to solder or other electrical connections. In embodiments, the chip connections "X" are located at the following discrete areas of each quadrant of the grid pattern, with respect to chip 600a:

(i) A connection in the lower left corner;
(ii) A connection at the juncture of the top row, second column;
(iii) A connection at the juncture of the second row, third column; and
(iv) A connection at the juncture of the third row, fourth column.

In the grid pattern configuration of FIG. 4, each of the chips can be rotated by 90 degrees and overlayed to form a stacked structure 610. In the stacked structure 610, none of the chip connections of the four chips 600a, 600b, 600c and 600d are shared amongst each other. This is shown by reference numerals 1, 2, 3, and 4, which are representative of the connections "X" for each of the four chips 600a, 600b, 600c and 600d. In this way, the blank areas for each chip are pass through through-silicon-vias (TSV) to solder connections, thus allowing a connection for another chip in such discrete areas. Accordingly, each chip can be discretely controlled by its individual, non-shared pin connections.

Figure 5:
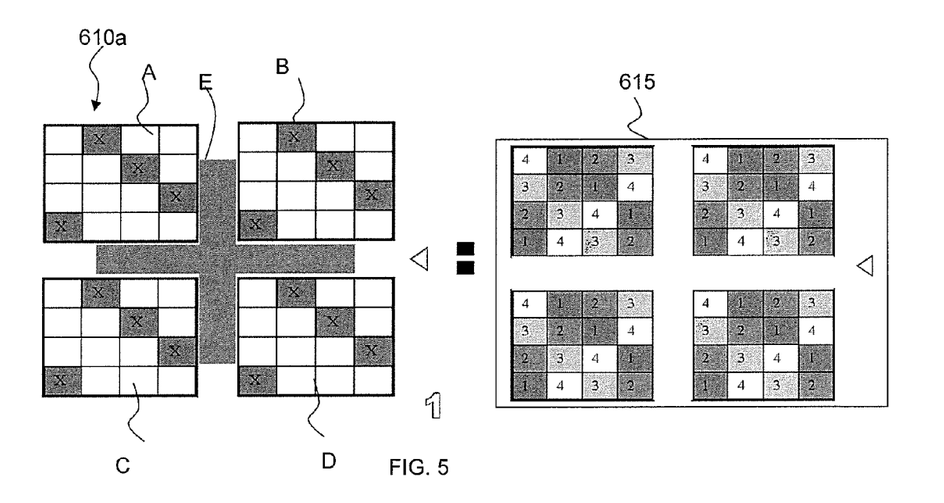
FIG. 5 shows the plurality of chips with the grid pattern of connections of FIG. 4, in addition to a global pin connection, in accordance with aspects of the present invention.

FIG. 5 shows a variation of the grid pattern of FIG. 4. More specifically, FIG. 5 shows a chip 610a with four quadrants, each having a grid pattern of connections in addition to at least one global pin connection. In FIG. 5, much like FIG. 4, the each chip includes a grid pattern comprising four quadrants A, B, C and D, each having 16 discrete areas. The areas designated with an "X" are independent chip connections for each chip for each quadrant A, B, C and D; whereas, the blank areas are pass through through-silicon-vias (TSV) to solder connections. In embodiments, the chip connections "X" are located at the same discrete areas of each quadrant of the grid pattern as described with respect to FIG. 4; however, each chip additionally includes one or more global pin connection E. The global pin connection E can be, for example, power pins, signal pins, etc., common to each chip. The global pin connections are located for example in gap regions between the quadrants A-D.

In the grid pattern configuration of FIG. 5, each of the chips can be rotated by 90 degrees and overlayed to form a stacked structure 615. In the stacked structure 615, the global pin connection E is shared amongst all of the chips; whereas, none of the remaining chip connections (designated at "X") of the four chips are shared amongst each other. This latter feature is shown by reference numerals 1, 2, 3, and 4, which are representative of the connections "X" for each chip having the four quadrants A, B, C and D. Accordingly, each chip can be discretely controlled by its individual, non-shared pin connections "X", or through the global connection E.

Figure 6:
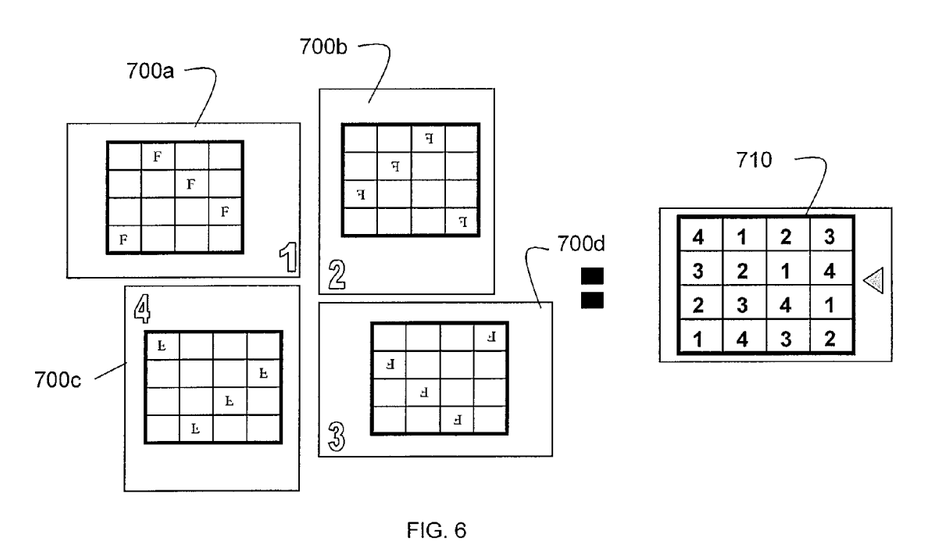
FIG. 6 shows a plurality of chips each having a same grid pattern of connections in accordance with aspects of the present invention.

FIG. 6 shows a plurality of chips, e.g., 4 chips, each having a same grid pattern of connections. The plurality of chips 700a, 700b, 700c and 700d include a grid pattern comprising 16 discrete areas, where the areas designated with an "F" are independent chip connections for each of the plurality of chips 700a, 700b, 700c and 700d; whereas, the blank areas are pass through through-silicon-vias (TSV) to solder or other electrical connections. In embodiments, the chip connections "F" are located at the following discrete areas of the grid pattern, with respect to chip 700a:

(i) A connection in the lower left corner;
(ii) A connection at the juncture of the top row, second column;
(iii) A connection at the juncture of the second row, third column; and
(iv) A connection at the juncture of the third row, fourth column.

In the grid pattern configuration of FIG. 6, each of the chips in the stack can be flip about its "X" and "Y" axis and overlayed to form a stacked structure 710. In the stacked structure 710, none of the chip connections of the four chips 700a, 700b, 700c and 700d are shared amongst each other. This is shown by reference numerals 1, 2, 3, and 4, which are representative of the connections "F" for each of the four chips 700a, 700b, 700c and 700d. In this way, the blank areas for each chip are pass through through-silicon-vias (TSV) to solder connections or other electrical connections, thus allowing a connection for another chip in such discrete areas. Accordingly, each chip can be discretely controlled by its individual, non-shared pin connections.

In the embodiment of FIG. 6, each 700a, 700b, 700c and 700d can be flipped over, which changes the dynamics of the chip stack. That is, it is now possible to stack the chips face-to-face, back-to-face or back-to-back, thus providing additional flexibility to the chip stack. In addition, it should be understood by those of skill in the art that the chips can be flipped, rotated or a combination of flipped and rotated, to form a stack structure of different configurations.

Figure 7:
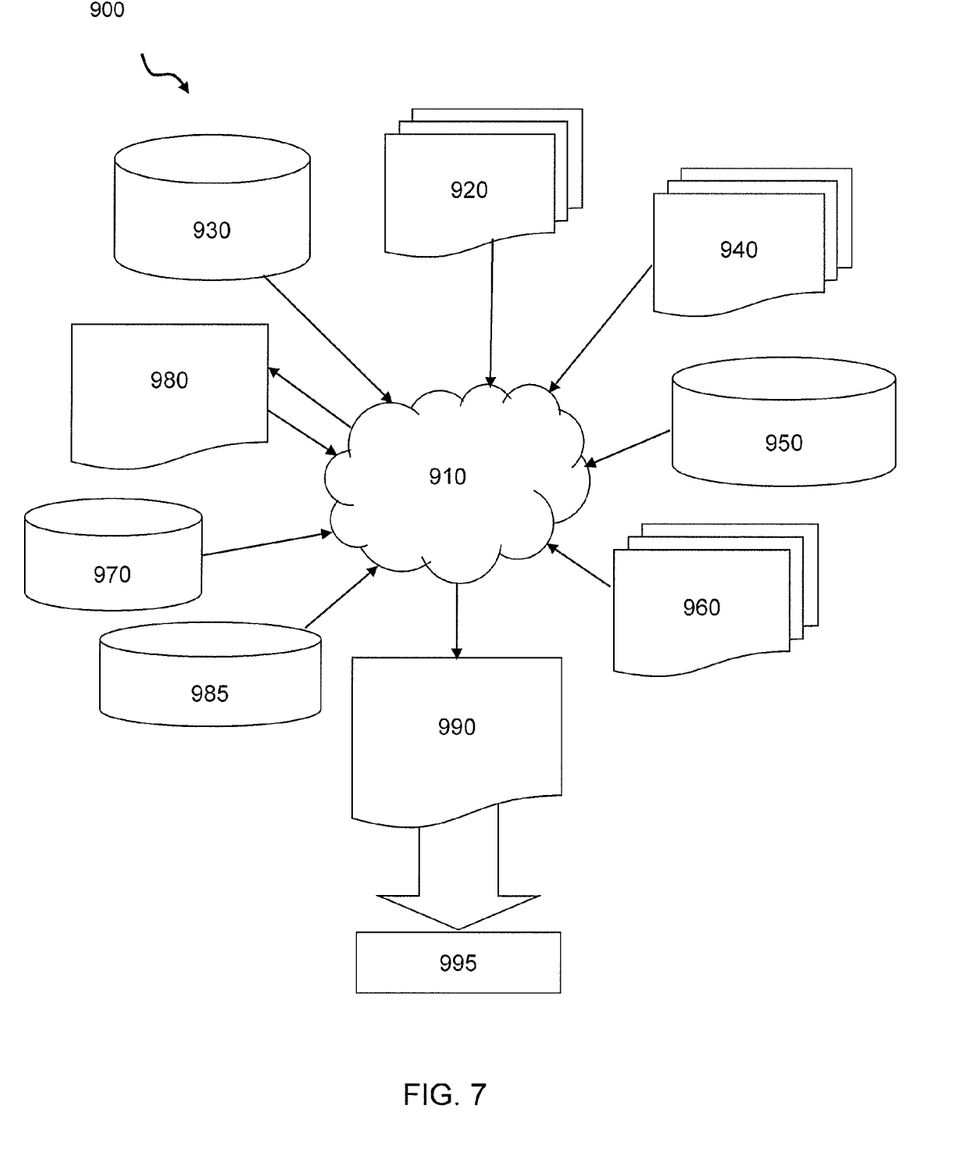
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 990 may comprise a compiled, executable HDL simulation model that functionally simulates the devices shown in FIGS. 1-6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A latch chain comprising:
a first latch chain, comprised of a single or multiple latches, associated with a first chip, the first latch chain structured to receive first address information from the first chip via a first plurality of pins; and
a second latch chain, comprised of a single or multiple latches, associated with a second chip, the second latch chain structured to receive second address information from the second chip via a second plurality of pins, wherein:
the first latch chain and the second latch chain are connected to one another such that they form a single latch chain that crosses chip boundaries; and
the first latch chain and the second latch chain are structured to provide identification information for identifying the first chip and the second chip, respectively.

2. The latch chain of claim 1, wherein:
the first latch chain includes a first storage device that stores the first address information received from the first chip; and
the second latch chain includes a second storage device that stores the second address information received from the second chip.

3. The structure of claim 2, wherein the latch storage is the first storage device and the second storage device are non-volatile memory.

4. The structure of claim 2, wherein, upon power up, the first address information and the second address information stored in the first storage device and the second storage device is read for discretely identifying and controlling at least one of the first chip and the second chip in a stack.

5. The structure of claim 2, wherein, in normal operation, the first storage device and the second storage device are set to sequential addresses.

6. The latch chain of claim 1, wherein:
the first chip and the second chip each include an additional plurality of pins, including control pins and a clock pin; and
the first latch chain and the second latch chain are structured to additionally read clock data received from at least the clock pin of the respective first chip and the second chip.

7. The latch chain of claim 6, further comprising:
a first chip enable circuit connecting to the control pins and the first latch chain of the first chip, and
a second chip enable circuit connecting to the control pins and second latch chain of the second chip,
wherein:
the first chip enable circuit is structured to compare the first address information of the first latch chain and control signal received from the control pins of the first chip to identify the first chip; and
the second chip enable circuit is structured to compare the second address information of the second latch chain and control signal received from the control pins of the second chip to identify the second chip.

8. The structure of claim 1, wherein the first latch chain and the second latch chain of the first chip and the second chip bridge between the first chip and the second chip, further comprising:
the first chip and the second chip provided in a stacked configuration, wherein:
the first chip and the second chip includes a respective plurality of non-shared, individual signal connections arranged in a same pattern of a grid,
the grid includes a plurality of rows along an "X" axis and a plurality of columns along a "Y" axis, and
when the first chi and the second chi are stacked the attern of each of the first chip and the second chip is oriented to permit the respective plurality of non-shared, individual signal connections amongst the first chip and the second chip.

9. The structure of claim 1, wherein the first chip and the second chip include a set pin, a load pin and a reset pin, connected to the first latch chain and the second latch chain of the first chip and the second chip, respectively.

10. The structure of claim 9, wherein:
the clock pin provides a clock value, and triggers the load pin and the set pin;
the load pins load the first address information into the first latch chain and the second address information into the second latch chain, respectively;
the set pins set the first address information into the first latch chain and the second address information into the second latch chain, respectively; and
the reset pins reset values in the first latch chain and the second latch chain of the first chip and the second chip, respectively.

11. The structure of claim 1, wherein:
the first chip and the second chip comprise a stacked structure;
the stacked structure includes:
a command enable circuit of the first chip and the second chip having connections to the first latch chain and the second latch chain on the first chip and the second chip, respectively; and
control pins comprising an A0 pin connection and A1 pin connection for the first chip and the second chip, respectively.

12. The structure of claim 1, further comprising a command enable circuit which provides a signal that goes through the first chip and the second chip, wherein the command enable circuit is configured to load data into any combination of identified chips in a stacked configuration of the first chip and the second chip.

13. The structure of claim 1, wherein:
the first chip includes a second latch in the first latch chain;
the second chip includes a second latch in the second latch chain;
data is serially loaded into the latches across the first chip and the second chip.

14. The structure of claim 13, wherein the first latch chain and the second latch chain of the first chip and the second chip are structured to be reset any time in order to place the first chip and the second chip into a global command mode.

15. A structure comprising a plurality of chips provided in a stacked configuration, wherein:
   the plurality of chips include a respective plurality of non-shared, individual signal connections arranged in a same pattern of a grid,
   the grid includes a plurality of rows along an "X" axis and a plurality of columns along a "Y" axis, and
   when the plurality of chips are stacked, the pattern of each of the plurality of chips is oriented to permit the respective plurality of non-shared, individual signal connections amongst the plurality of chips.

16. The structure of claim 15, wherein the plurality of chips are four chips in the stacked configuration, with each underlying chip at a different orientation than an overlying chip of the plurality of chips, wherein the different orientation is a flipping about one of the "X" axis and the "Y" axis.

17. The structure of claim 16, wherein the non-shared, individual signal connections are provided in separate rectangular quadrants of the grid.

18. The structure of claim 15, wherein:
   the respective plurality of non-shared, individual signal connections include four connections;
   a first-row of the grid is a bottom-most row;
   a first column of the grid is a left-most column; and
   a pattern of the grid comprises:
      a first of the four connections located at the first row and the first column of the grid;
      a second of the four connections located at a top-most row and a second column, which is adjacent to the first column;
      a third of the four connections is located at a second row, which is adjacent to the first row, and a third column, which is adjacent to the second column; and
      a fourth of the four connections located at a third row, which is adjacent to the second row, and a fourth column, which is adjacent to the third column.

19. A method comprising independent addressing of identical integrated chips in a through-silicon-via chip stack, which occurs after chip stacking;
   wherein each of the independently addressed integrated chips is identical; and
   each of the independently addressed integrated chips are discretely controlled by its individual, non-shared pin connections, or controlled through a global connection.

20. A latch chain comprising:
   a first latch chain, comprised of a single or multiple latches, associated with a first chip, the first latch chain structured to read data information from the first chip; and
   a second latch chain, comprised of a single or multiple latches, associated with a second chip, the second latch chain structured to read data information from the second chip, wherein:
      the first latch chain and the second latch chain are connected to one another such that they form a single latch chain that crosses chip boundaries;
      the first latch chain and the second latch chain are structured to provide identification information for identifying the first chip and the second chip, respectively, and
      every chip in the latch chain, including the first chip and the second chip, is identical.

* * * * *